(12) United States Patent
Dautenhahn (10) Patent No.: US 9,427,819 B2
(45) Date of Patent: Aug. 30, 2016

(54) PRE-HEATER LATCH AND SEAL MECHANISM FOR WAVE SOLDER MACHINE AND RELATED METHOD

(71) Applicant: Illinois Tool Works Inc., Glenview, IL (US)

(72) Inventor: Jonathan M. Dautenhahn, Linn Creek, MO (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 14/842,226

(22) Filed: Sep. 1, 2015

(65) Prior Publication Data
US 2015/0367438 A1 Dec. 24, 2015

Related U.S. Application Data

(62) Division of application No. 14/189,743, filed on Feb. 25, 2014, now Pat. No. 9,161,459.

(51) Int. Cl.
*B23K 37/00* (2006.01)
*B23K 3/08* (2006.01)
(Continued)

(52) U.S. Cl.
CPC ............ *B23K 3/08* (2013.01); *B23K 1/008* (2013.01); *B23K 1/0016* (2013.01); *B23K 1/085* (2013.01);
(Continued)

(58) Field of Classification Search
CPC ...... B23K 1/00; B23K 1/0016; B23K 1/085; B23K 3/0653; B23K 31/02; B23K 2201/36–2201/42; B23K 3/08; B23K 3/082; B23K 1/008; B23K 3/047; H05K 3/341; H05K 3/3468; H05K 2203/044; H05K 3/34; H01T 23/60; F27B 17/0025; F27B 9/029; Y10T 29/49826
USPC ................. 228/256, 260, 33, 37, 43
See application file for complete search history.

(56) References Cited

U.S. PATENT DOCUMENTS

| | | | |
|---|---|---|---|
| 3,482,755 A | 12/1969 | Raciti | |
| 3,515,330 A | 6/1970 | Bronson et al. | |

(Continued)

FOREIGN PATENT DOCUMENTS

| | | |
|---|---|---|
| CN | 2610608 Y | 4/2004 |
| CN | 1893774 A | 1/2007 |

(Continued)

OTHER PUBLICATIONS

Notification of Transmittal of the International Search Report and the Written Opinion of the International Searching Authority from corresponding PCT/US2014/066283 dated Jun. 29, 2015.

*Primary Examiner* — Kiley Stoner
(74) *Attorney, Agent, or Firm* — Lando & Anastasi, LLP (57) ABSTRACT

A wave solder machine includes a pre-heating station, a wave soldering station, and a conveyor to transport substrates through a tunnel passing through the pre-heating station and the wave soldering station. The tunnel has a substantially oxygen-free environment. The pre-heating station includes a pre-heater including a support frame assembly, and a heater assembly supported by the support frame assembly. The heater assembly is slidably coupled to the support frame assembly between an operational position and a non-operational position. The pre-heater further includes a seal disposed between the heater assembly and the support frame assembly. The seal provides a gas-tight seal when the heater assembly is in the operational position to prevent atmosphere from entering the tunnel thereby preserving the substantially oxygen-free environment within the tunnel.

8 Claims, 12 Drawing Sheets

(51) Int. Cl.
*H05K 3/34* (2006.01)
*B23K 3/06* (2006.01)
*B23K 1/08* (2006.01)
*B23K 1/00* (2006.01)
*B23K 1/008* (2006.01)
*F27B 9/02* (2006.01)
*H01T 23/00* (2006.01)
*B23K 3/047* (2006.01)
*F27B 17/00* (2006.01)

(52) U.S. Cl.
CPC ............. *B23K 3/047* (2013.01); *B23K 3/0653* (2013.01); *B23K 3/082* (2013.01); *F27B 9/029* (2013.01); *F27B 17/0025* (2013.01); *H01T 23/00* (2013.01); *H05K 3/34* (2013.01); *H05K 3/341* (2013.01); *H05K 3/3468* (2013.01); *H05K 2203/044* (2013.01); *Y10T 29/49826* (2015.01)

(56) References Cited

U.S. PATENT DOCUMENTS

| | | | |
|---|---|---|---|
| 3,604,611 A * | 9/1971 | Lamberty | B23K 1/20 118/429 |
| 4,079,879 A | 3/1978 | Watson, Jr. | |
| 4,139,143 A | 2/1979 | Gumprecht | |
| 4,295,868 A | 10/1981 | Holter et al. | |
| 4,366,351 A | 12/1982 | Ditzig | |
| 4,478,364 A | 10/1984 | Ditzig | |
| 4,533,187 A | 8/1985 | Kirkman | |
| 4,538,757 A * | 9/1985 | Bertiger | B23K 1/008 228/180.1 |
| 4,546,228 A | 10/1985 | Bonhomme | |
| 4,659,003 A | 4/1987 | Simonetti | |
| 4,775,776 A | 10/1988 | Rahn et al. | |
| 4,798,218 A | 1/1989 | Sauvan | |
| 4,881,320 A | 11/1989 | Kohle et al. | |
| 4,921,156 A | 5/1990 | Hohnerlein | |
| 4,995,411 A | 2/1991 | Lowell et al. | |
| 5,023,848 A | 6/1991 | Frey et al. | |
| 5,026,295 A | 6/1991 | Fong et al. | |
| 5,048,746 A | 9/1991 | Elliott et al. | |
| 5,069,380 A | 12/1991 | Deambrosio | |
| 5,121,874 A | 6/1992 | Deambrosio et al. | |
| 5,161,727 A | 11/1992 | Leturmy et al. | |
| 5,163,599 A | 11/1992 | Mishina et al. | |
| 5,188,527 A | 2/1993 | Laiquddin et al. | |
| 5,193,735 A | 3/1993 | Knight | |
| 5,209,389 A | 5/1993 | Sullivan et al. | |
| 5,230,460 A | 7/1993 | Deamborsio et al. | |
| 5,240,169 A | 8/1993 | Gileta | |
| 5,322,209 A | 6/1994 | Barten et al. | |
| 5,347,103 A | 9/1994 | LeMieux | |
| 5,358,166 A | 10/1994 | Mishina et al. | |
| 5,364,007 A | 11/1994 | Jacobs et al. | |
| 5,379,943 A | 1/1995 | Gibson | |
| 5,388,468 A | 2/1995 | Sasson | |
| 5,398,865 A | 3/1995 | Mittag | |
| 5,405,074 A | 4/1995 | Den Dopper et al. | |
| 5,440,101 A | 8/1995 | Cox et al. | |
| 5,472,135 A | 12/1995 | Taniguchi et al. | |
| 5,492,265 A * | 2/1996 | Wandke | B23K 1/0016 228/205 |
| 5,520,320 A | 5/1996 | McKean et al. | |
| 5,524,810 A | 6/1996 | Wathne | |
| 5,611,476 A | 3/1997 | Soderlund et al. | |
| 5,911,486 A | 6/1999 | Dow et al. | |
| 5,941,448 A | 8/1999 | Sindzingre et al. | |
| 5,971,246 A | 10/1999 | Aun et al. | |
| 6,074,203 A | 6/2000 | Leturmy et al. | |
| 6,123,250 A | 9/2000 | De Klein et al. | |
| RE36,960 E | 11/2000 | Boswell et al. | |
| 6,145,734 A | 11/2000 | Taniguchi et al. | |
| 6,345,757 B1 | 2/2002 | Sakuyama et al. | |
| 6,354,481 B1 | 3/2002 | Rich et al. | |
| 6,386,422 B1 | 5/2002 | Cheng et al. | |
| 6,394,794 B2 | 5/2002 | Bloom et al. | |
| 6,402,011 B1 | 6/2002 | Taniguchi et al. | |
| 6,437,289 B1 | 8/2002 | Yokota | |
| 6,446,855 B1 | 9/2002 | Rich | |
| 6,510,978 B1 | 1/2003 | Koshi et al. | |
| 6,576,030 B2 | 6/2003 | Mullins | |
| 6,686,566 B1 | 2/2004 | Corey | |
| 6,749,655 B2 | 6/2004 | Dautenhahn | |
| 6,761,301 B2 | 7/2004 | Mukuno et al. | |
| 7,150,418 B2 | 12/2006 | Watanabe et al. | |
| 7,690,550 B2 | 4/2010 | Yokota | |
| 7,708,183 B2 | 5/2010 | Dautenhahn | |
| 7,735,708 B2 | 6/2010 | Yamada | |
| 7,951,244 B2 | 5/2011 | Becker et al. | |
| 7,988,031 B2 | 8/2011 | Nakamura et al. | |
| 8,110,015 B2 | 2/2012 | Neiderman et al. | |
| 8,128,720 B2 | 3/2012 | Neiderman et al. | |
| 8,196,799 B2 | 6/2012 | Dautenhahn | |
| 8,348,138 B2 | 1/2013 | Dautenhahn | |
| 2002/0162308 A1 | 11/2002 | Mullins et al. | |
| 2002/0179693 A1 | 12/2002 | Kawashima et al. | |
| 2003/0196551 A1 | 10/2003 | Dautenhahn | |
| 2003/0218058 A1 | 11/2003 | Shaw et al. | |
| 2004/0178251 A1 | 9/2004 | Trucco | |
| 2005/0050866 A1 | 3/2005 | Mullins | |
| 2005/0173497 A1 | 8/2005 | Dokkedahl | |
| 2006/0197266 A1 | 9/2006 | Keith | |
| 2007/0045382 A1 | 3/2007 | Shibamura et al. | |
| 2007/0241165 A1 | 10/2007 | Deram et al. | |
| 2008/0295686 A1 | 12/2008 | Neiderman et al. | |
| 2008/0302861 A1 * | 12/2008 | Szymanowski | B23K 3/0653 228/223 |
| 2009/0236402 A1 | 9/2009 | Willenegger et al. | |
| 2009/0282973 A1 | 11/2009 | Nakamura et al. | |
| 2010/0012709 A1 | 1/2010 | Nikaido et al. | |
| 2010/0219568 A1 | 9/2010 | Opferkuch | |
| 2010/0264197 A1 | 10/2010 | Aoyama et al. | |
| 2011/0226843 A1 * | 9/2011 | Yanaros | B23K 1/0008 228/260 |
| 2011/0315746 A1 | 12/2011 | Dautenhahn | |
| 2013/0062399 A1 | 3/2013 | McQuirk | |
| 2013/0098974 A1 | 4/2013 | Dong et al. | |
| 2013/0119112 A1 | 5/2013 | Sukekawa et al. | |
| 2013/0175323 A1 | 7/2013 | Zhang et al. | |
| 2014/0027495 A1 | 1/2014 | Arslanian et al. | |
| 2014/0109431 A1 | 4/2014 | Lee et al. | |
| 2014/0209661 A1 * | 7/2014 | Hsieh | B23K 3/0653 228/37 |
| 2015/0216092 A1 * | 7/2015 | Dautenhahn | H05K 13/0465 228/234.1 |

FOREIGN PATENT DOCUMENTS

| | | |
|---|---|---|
| CN | 201227707 Y | 4/2009 |
| CN | 101648304 A | 2/2010 |
| CN | 201824037 U | 5/2011 |
| EP | 0681418 B1 | 8/1999 |
| EP | 1732118 A1 | 12/2006 |
| GB | 1504540 A | 3/1978 |
| JP | 62130770 A | 6/1987 |
| JP | 2002198642 A | 7/2002 |
| JP | 2005079466 A | 3/2005 |
| JP | 5077038 A | 11/2012 |

* cited by examiner

PRE-HEATER LATCH AND SEAL MECHANISM FOR WAVE SOLDER MACHINE AND RELATED METHOD

RELATED APPLICATIONS

This application is a divisional of pending U.S. patent application Ser. No. 14/189,743, filed Feb. 25, 2014, entitled PRE-HEATER LATCH AND SEAL MECHANISM FOR WAVE SOLDER MACHINE AND RELATED METHOD, which is incorporated herein by reference in its entirety.

BACKGROUND OF THE INVENTION

1. Field of the Disclosure

This application relates generally to the surface mount of electronic components onto a printed circuit board by employing a wave soldering process, and more particularly to a latch and seal mechanism that is configured to ensure an oxygen-free environment during the wave soldering process.

2. Discussion of Related Art

In the fabrication of printed circuit boards, electronic components can be mounted to a printed circuit board by a process known as "wave soldering." In a typical wave solder machine, a printed circuit board is moved by a conveyor on an inclined path past a fluxing station, a pre-heating station, and finally a wave soldering station. At the wave soldering station, a wave of solder is caused to well upwardly (by means of a pump) through a wave solder nozzle and contact portions of the printed circuit board to be soldered. As used herein, the term "circuit board" or "printed circuit board," as used herein, includes any type of substrate assembly of electronic components, including, for example, wafer substrates.

The wave soldering process has recently advanced by transitioning from traditional tin-lead solder to lead-free materials. These new soldering materials have reduced the process windows to the point that some processes now require pre-heating in an oxygen-free environment to prevent oxide formation on solder joints prior to the soldering process. Prior pre-heater assemblies lack the ability to hinge down to decompress a seal and remove contact between the pre-heater and the seal. Prior seals were typically attached by adhesives or mechanical fasteners, and thus are not easily replaced.

BRIEF SUMMARY OF THE INVENTION

One embodiment of the present disclosure is directed to a wave solder machine configured to perform a wave solder operation on an electronic substrate. In one embodiment, the wave solder machine comprises a pre-heating station configured to heat the electronic substrate, a wave soldering station configured to attach electronic components to the electronic substrate with solder, and a conveyor configured to transport substrates through a tunnel passing through the pre-heating station and the wave soldering station. The tunnel has a substantially oxygen-free environment. The pre-heating station includes at least one pre-heater including a support frame assembly, and a heater assembly supported by the support frame assembly forming part of the tunnel. The heater assembly is slidably coupled to the support frame assembly between an operational position and a non-operational position. The pre-heater further includes at least one seal disposed between the heater assembly and the support frame assembly. The at least one seal provides a gas-tight seal when the heater assembly is in the operational position to prevent atmosphere from entering the tunnel thereby preserving the substantially oxygen-free environment within the tunnel.

Embodiments of the wave solder machine further include a seal retainer of the pre-heater that is configured to secure the at least one seal to the support frame assembly. The seal retainer may be rectangular in shape and sized to receive the at least one seal therein. The at least one seal may be triangular-shaped in cross section. Each seal retainer may include a base portion and two arm portions extending up from the base portion at opposite sides of the base portion, with the arm portions being configured to engage the at least one seal and secure the at least one seal so that the at least one seal is seated on the base portion. The at least one seal may be fabricated from silicone material. The pre-heater further may include a latch coupled to heater assembly to releasably secure the heater assembly in the operational position to compress the at least one seal.

Another aspect of the disclosure is directed to a wave solder machine comprising a pre-heating station configured to heat the electronic substrate, a wave soldering station configured to attach electronic components to the electronic substrate with solder, and a conveyor configured to transport substrates through a tunnel passing through the pre-heating station and the wave soldering station. In one embodiment, the pre-heating station includes at least one pre-heater including a support frame assembly, and a support tray slidably coupled to the support frame assembly. The support tray is movable between a closed position in which the support tray is slid into the support frame assembly and an open position in which the support tray is slid out of the support frame assembly. The pre-heater further includes a heater disposed in the support tray, and a latch mechanism configured to releasably secure the support tray in the closed position.

Embodiments of the wave solder machine further may include a pivot bracket of the support frame assembly that is secured to the tunnel. The support frame assembly further may include two side plates, with each side plate being secured at one end thereof to the pivot bracket by a pivot pin. The support frame assembly further may include a latch and guide bracket secured to side plates. The pre-heater further may include a seal disposed between the heater and the support frame assembly, with the seal being compressed when the support tray is in its closed position. The support frame assembly further may include two drawer slides, one for each side plate, which are configured to enable the support tray to slide between its closed and open positions. The latch mechanism may include a latch secured to the support frame assembly, with the latch mechanism being configured to releasably secure the support tray. The support frame assembly further may include a slide catch releasably secured to the support frame assembly, with the slide catch being configured to prevent the support tray from accidentally sliding out when the support tray is moved to its open position.

Another aspect of the present disclosure is directed to a method of sealing a tunnel from a pre-heater within a wave soldering machine of the type comprising a pre-heating station including at least one pre-heater and configured to heat the electronic substrate, a wave soldering station configured to attach electronic components to the electronic substrate with solder, and a conveyor configured to transport substrates through a tunnel passing through the pre-heating station and the wave soldering station, with the tunnel having a substantially oxygen-free environment. In one embodiment, the method comprises: positioning a at least one seal between a heater assembly of the pre-heater and a support frame assembly; and securing the at least one seal to the support frame assembly with a retainer, with the at least one seal providing a gas-tight seal when the heater assembly is in an operational position to prevent atmosphere from entering the tunnel thereby preserving the substantially oxygen-free environment within the tunnel.

Embodiments of the method further may comprise slidably coupling a support tray of the heater assembly to a support frame assembly of the pre-heater, with the support tray being configured to support an electric heater element and movable between a closed position in which the support tray is slid into the support frame assembly and an open position in which the support tray is slid out of the support frame assembly. The method further may comprise securing the support tray in the closed position with a latch mechanism coupled to the support tray and the support frame assembly. The method further may comprise guiding the movement of the support tray between its closed and open positions. The at least one seal may be triangular-shaped in cross section. The retainer may include a base portion and two arm portions extending up from the base portion at opposite sides of the base portion, with the arm portions being configured to engage the at least one seal and secure the at least one seal so that the at least one seal is seated on the base portion.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Wave solder machines are typically designed to incorporate a series of pre-heaters which serve the purpose of heating a printed circuit board ("PCB") prior to contact with the molten solder bath. Some processes require that this heating be done in an oxygen-free environment. For these processes, the pre-heaters must be sealed with respect to a conveyor tunnel through which printed circuit boards travel so as to not allow infiltration of outside air. The pre-heater assembly of embodiments of the present disclosure incorporates a unique latch that enables the pre-heater to be easily slid out from the conveyor tunnel for maintenance activities. The pre-heater assembly further incorporates a sealing method that allows atmosphere seals to be easily replaced when they reach the end of their usable life.

Figure 1:
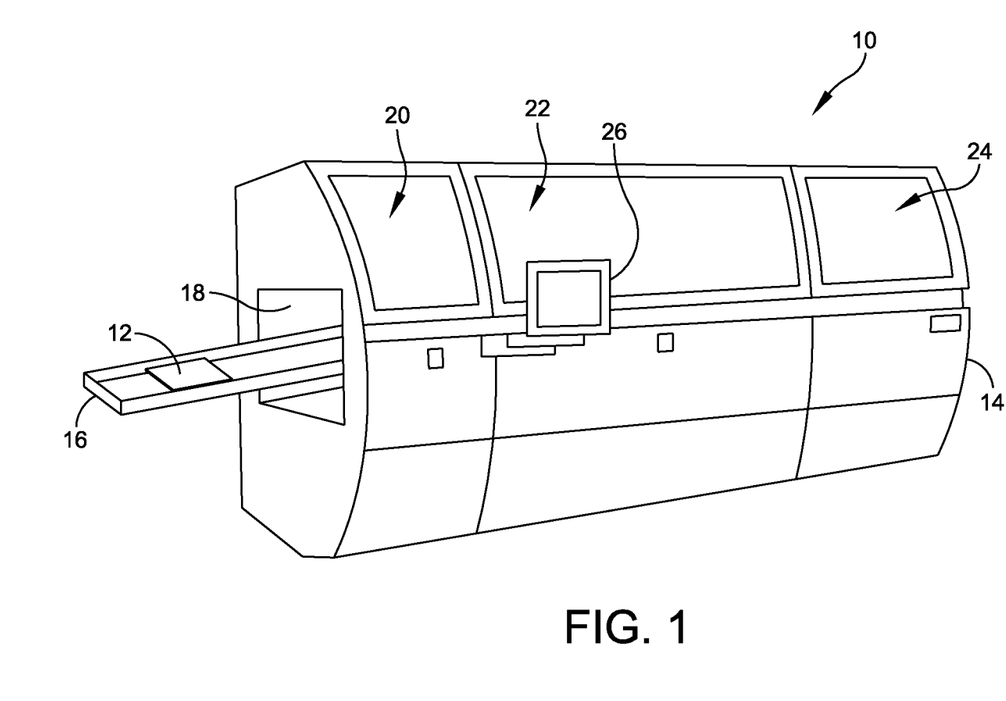
FIG. 1 is a perspective view of a wave solder machine.

For purposes of illustration, and with reference to FIG. 1, embodiments of the present disclosure will now be described with reference to a wave solder machine, generally indicated at 10, which is used to perform a solder application on a printed circuit board 12, which may be referred to herein as an electronic substrate. The wave solder machine 10 is one of several machines in a printed circuit board fabrication/assembly line. As shown, the wave solder machine 10 includes a housing 14 adapted to house the components of the machine. The arrangement is such that a conveyor 16 delivers printed circuit boards to be processed by the wave solder machine 10. Upon entering the wave solder machine 10, each printed circuit board 12 travels along an inclined path along the conveyor 16 through a tunnel 18, which includes a fluxing station, generally indicated at 20, and a pre-heating station, generally indicated at 22, to condition the printed circuit board for wave soldering. Once conditioned (i.e., heated), the printed circuit board 12 travels to a wave soldering station, generally indicated at 24, to apply solder material to the printed circuit board. A controller 26 is provided to automate the operation of the several stations of the wave solder machine 10, including but not limited to the fluxing station 20, the pre-heating station 22, and the wave soldering station 24, in the well known manner.

Figure 2:
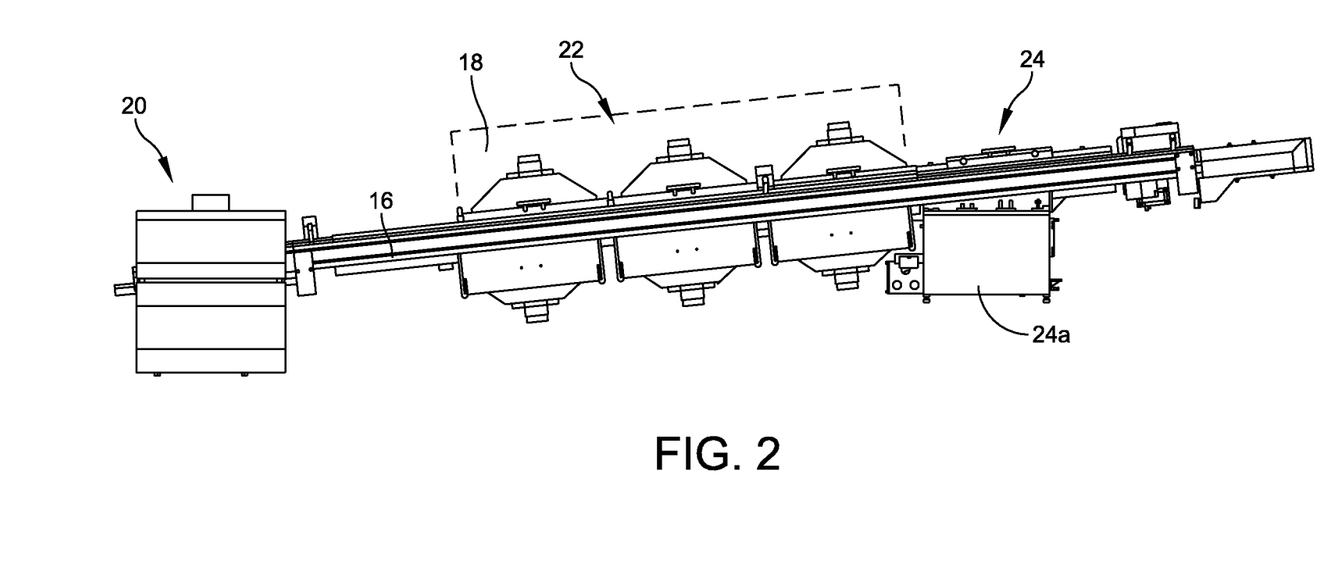
FIG. 2 is a side elevational view of the wave solder machine with external packaging removed to reveal internal components of the wave solder machine, including multiple pre-heater assemblies.

Referring to FIG. 2, the fluxing station 20 is configured to apply flux to the printed circuit board as it travels on the conveyor 16 through the wave solder machine 10. The pre-heating station 22 includes several pre-heaters, which are designed to incrementally increase the temperature of the printed circuit board as it travels along the conveyor 16 through the tunnel 18 to prepare the printed circuit board for the wave soldering process. As shown, the wave soldering station 24 includes a wave solder nozzle in fluid communication with a reservoir 24a of solder material. A pump is provided within the reservoir to deliver molten solder material to the wave solder nozzle from the reservoir. Once soldered, the printed circuit board exits the wave solder machine 10 via the conveyor 16 to another station provided in the fabrication line, e.g., a pick-and-place machine. In some embodiments, the wave solder machine 10 may be further configured to include a flux management system to remove volatile contaminants from the tunnel 18 of the wave solder machine.

Figure 3:
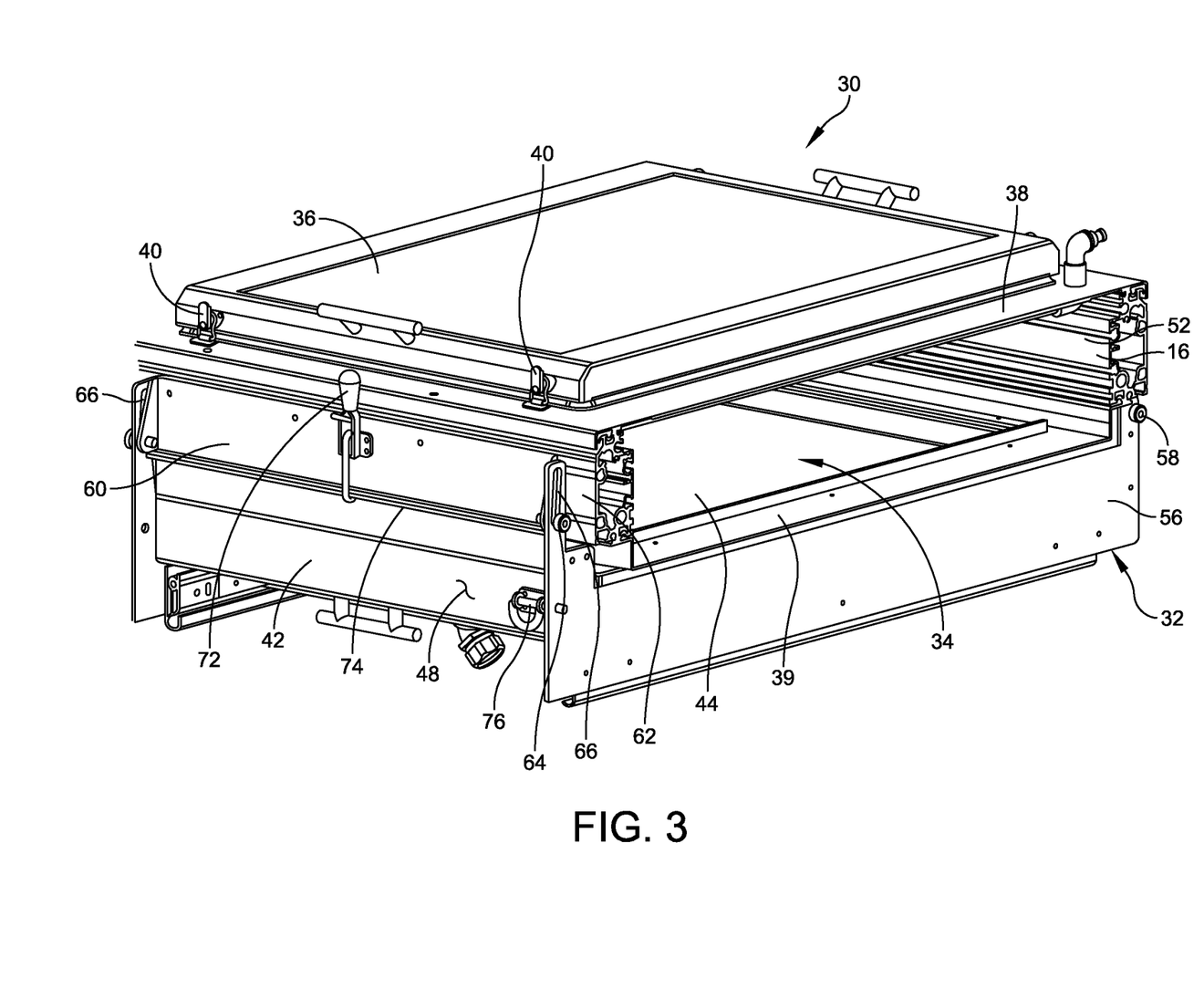
FIG. 3 is a perspective view of a pre-heater assembly of an embodiment of the present disclosure.

Referring to FIG. 3, the pre-heater assembly or pre-heater of the pre-heating station 22 is generally indicated at 30. As described above, in one embodiment, the pre-heating station 22 includes three pre-heaters 30, which can be configured to incrementally increase the temperature of the printed circuit board 12 as it travels through the tunnel 18 in preparation of a wave soldering operation being performed on the printed circuit board. It should be understood that the pre-heating station 22 may be configured to employ any number of pre-heaters, and still fall within the scope of the present disclosure. In a certain embodiment, the pre-heater 30 includes a support frame assembly, generally indicated at 32, and a heater assembly, generally indicated 34, which is disposed in and supported by the support frame assembly. As shown, the support frame assembly 32 of the pre-heater 30 includes a cover 36, which is releasably coupled to a top cover frame 38 of the support frame assembly 32 by four latches, each indicated at 40, provided at the corners of the cover. The pre-heater 30 further includes a bottom cover frame 39, which is constructed in a similar manner as the top cover 38. The cover 36 is movable between a closed or shut position in which the cover is secured to the top cover frame 38 by the latches 40 to enclose the heater assembly 34 and to prevent access to an interior of the pre-heater 30, and an open or removed position in which the cover is removed from the top cover frame to enable access to the pre-heater. In one embodiment, the cover 36 is sealed with respect to the top cover frame 38 to prevent oxygenated gas from entering the tunnel 18. The arrangement is such that when the cover 36 is positioned in its closed position on the top cover frame 38, the cover and top cover frame create a top of the tunnel that envelops the printed circuit board 12 on all sides as the printed circuit board passes through the wave solder machine 10 toward the wave soldering station 24. When capped with the cover 36 on top and the heater assembly 34 on bottom, the tunnel 18 creates a chamber such that when nitrogen is injected an oxygen-free environment is created. As stated above, the cover 36 enables access to the heater assembly 34 from above the tunnel 18.

Figure 4:
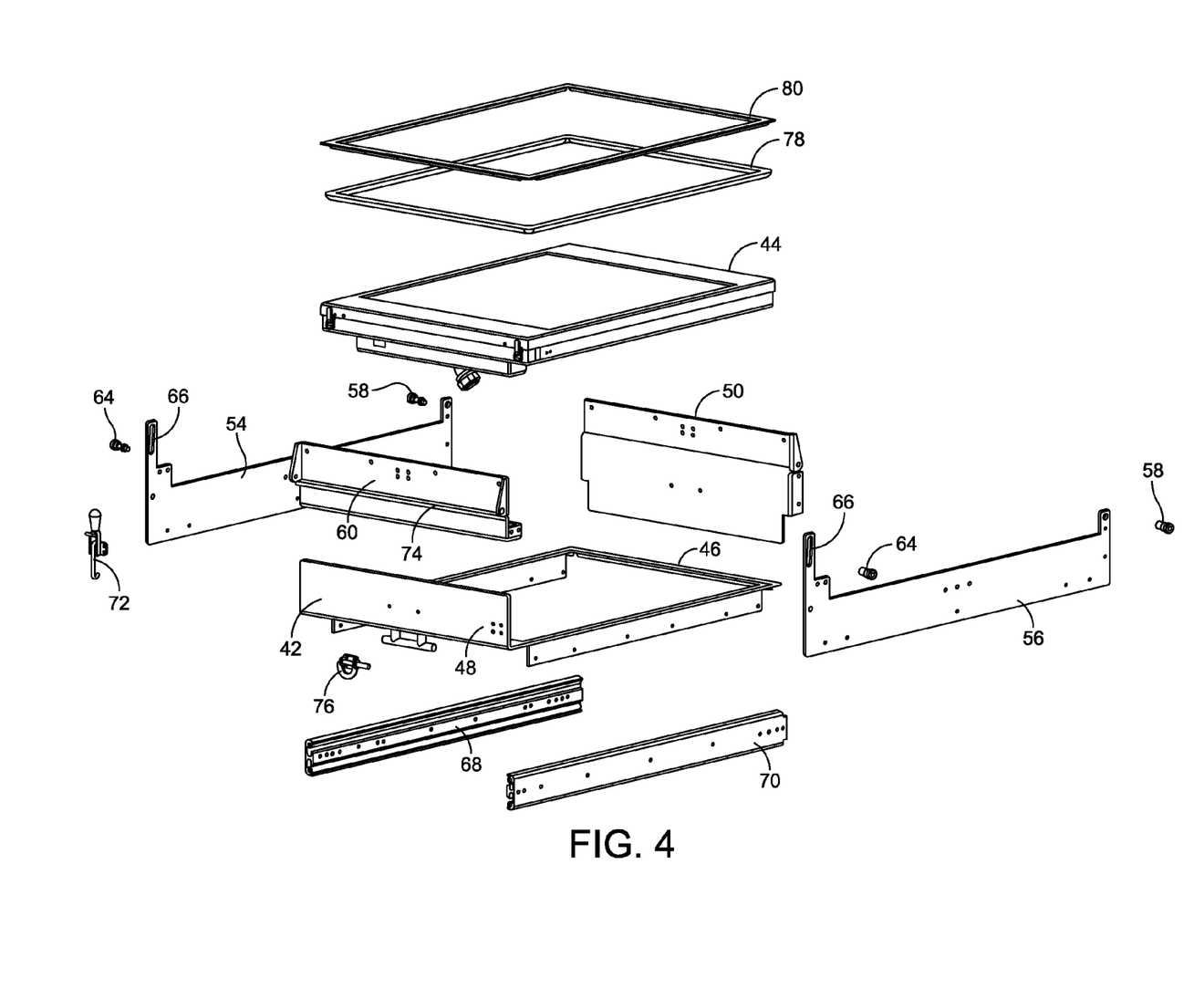
FIG. 4 is an exploded perspective view of a pre-heater assembly.

Referring to FIG. 4, the heater assembly 34 of the pre-heater 30 further includes a support tray 42 that is slidably coupled to the support frame assembly 32. As shown, the support tray 42 is sized and shaped to receive an electric heater element 44 within the support tray. The support tray 42 includes a rectangular frame 46 configured to receive the electric heater element 44 and a front wall 48 positioned at a front of the rectangular frame. The support tray 42 is movable within the support frame assembly 32 between a closed, operational position in which the support tray is slid into the support frame assembly, and an open, non-operational position in which the support tray is slid out of the support frame assembly. The support tray 42 is provided to provide easy access to the electric heater element 44 for maintenance or replacement. The support frame assembly 32 includes a pivot bracket 50 secured to a back rail 52 of the conveyor 16, and positioned at a back of the tunnel 18 to engage a back side of the rectangular frame 46 of the support tray 42 when the support tray is in its closed position.

The support frame assembly 32 further includes two side plates 54, 56, one for each side of the support tray 42. As best shown in FIG. 4, one end of each side plate 54, 56 is secured to the pivot bracket 50 by a pivot pin 58. The support frame assembly 32 further includes a latch and guide bracket 60 secured to a front rail 62 of the conveyor 16 and coupled to the other ends of the side plates 54, 56, and positioned at a front of the tunnel 18 above the front wall 48 of the support tray 42. Each side plate 54, 56 is pivotally secured to the latch and guide bracket 60 by a guide pin 64, which is received within an elongated slot 66 provided in the side plate. The arrangement is such that the side plates 54, 56 are able to pivot at a front of the pre-heater 30 to enable the support tray 42 to be moved to its open position. The support frame assembly 32 further includes two drawer slides 68, 70, one for each side plate 54, 56, which are secured to their respective side plates. The slides 68, 70 are configured to enable the support tray 42 to slide between its closed and open positions. The top cover frame 38 and the bottom cover frame 39 are mounted on the back and front rails 52, 62, in which the cover frames and rails surround the conveyor 16 and form the tunnel 18, which creates the barrier for the oxygen-free atmosphere.

The support frame assembly 32 further includes a latch mechanism configured to releasably secure the support tray 42 in the closed position. In this position, the pre-heater can operate to provide heat to printed circuit boards traveling through the tunnel 18 on the conveyor. In one embodiment, the latch mechanism includes a latch 72 secured to the latch and guide bracket 60, the latch being configured to releasably engage and secure an edge formed on a separate rail 74. The separate rail 74 is mechanically fastened to the side plates 54, 56, and provides the formed edge 74 that the latch 72 engages. The support frame assembly 32 further includes a slide catch 76 that is releasably secured to one of the side plates (e.g., side plate 56) to prevent the support tray 42 from accidentally sliding out when the assembly is hinged down in the manner described below.

Figure 5:
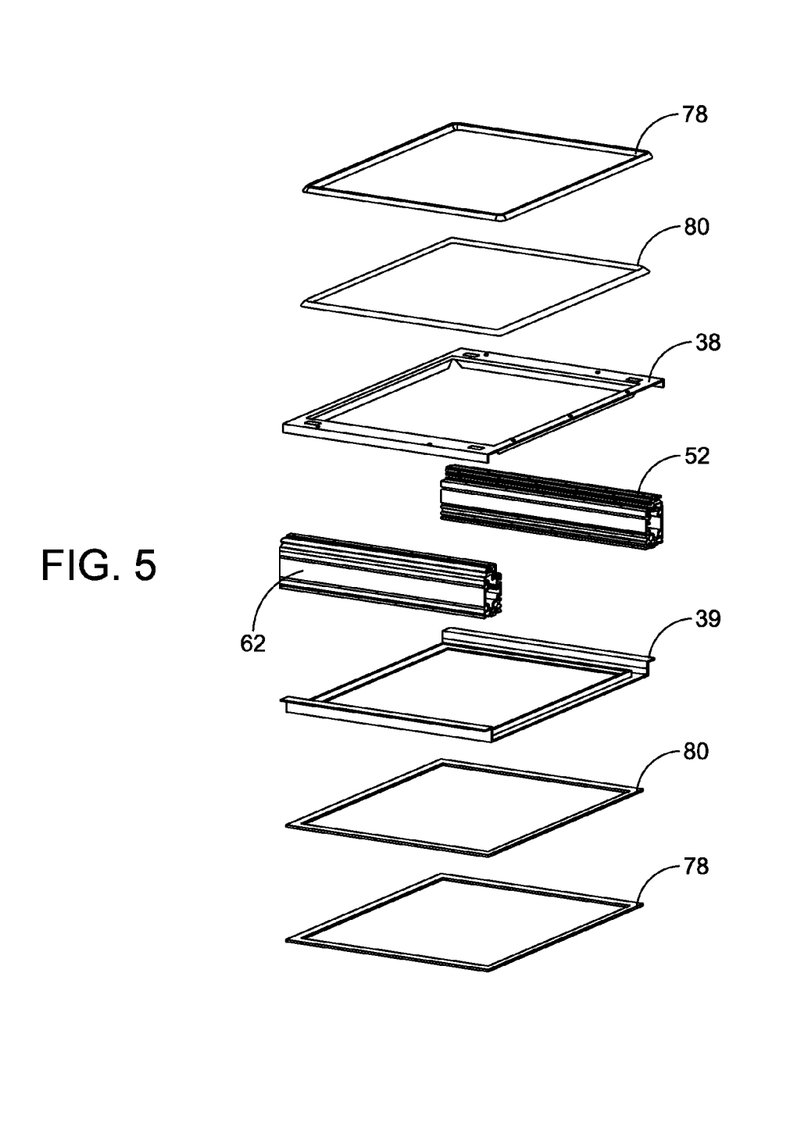
FIG. 5 is an exploded perspective view of sealing components of the pre-heater assembly.
Figure 6A:
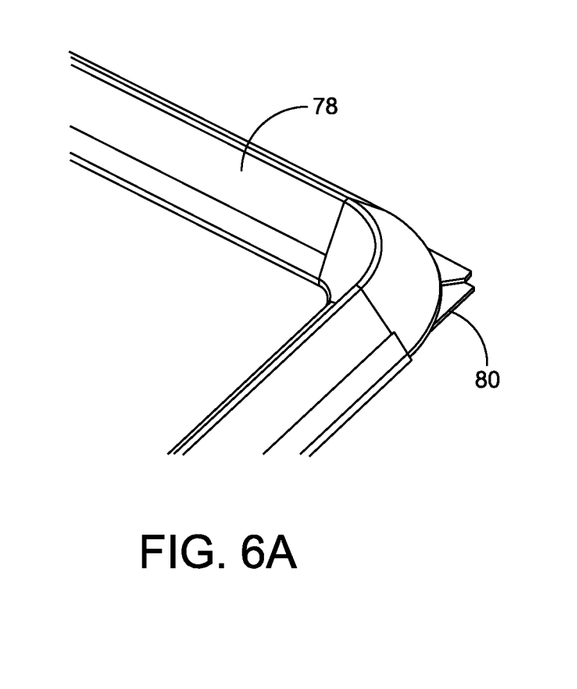
FIGS. 6A and 6B are enlarged views of a seal and a seal retainer of the pre-heater assembly.
Figure 6B:
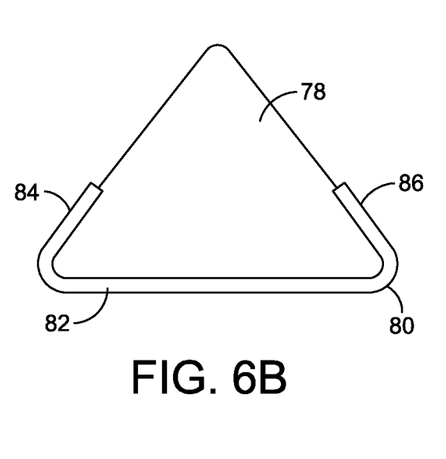

Referring additionally to FIGS. 5, 6A and 6B, the pre-heater 30 further includes a seal 78 disposed between the cover 36 and the top cover frame 38. The seal 78 is positioned to provide a gas-tight seal when the cover 36 is in a closed position to prevent atmosphere from entering the tunnel 18 thereby preserving the substantially oxygen-free environment. In the shown embodiment, the seal 78 is held in place on the top cover frame 38 by a seal retainer 80 configured to secure the seal to the top cover frame 38. In other embodiments, the seal retainer 80 could be secured to the cover 36 instead of the top cover frame 38. Similarly, another seal 78 is disposed between the bottom cover frame 39 and the electric heater element 44. This second seal 78 is held in place on the bottom cover frame 39 by another seal retainer 80 configured to secure the seal to the bottom cover frame 39. It should be understood that the seal retainer 80 could be secured to the electric heater element 44 instead of the bottom cover frame 39. As shown in FIG. 5, the seal retainer 80 is rectangular in shape, and sized to receive the seal 78 therein. In some embodiments, the seal retainer 80 may be configured from separate parts or pieces.

As best shown in FIG. 6B, the seal 78 is triangular-shaped in cross section. However, other shapes suitable for providing a tight seal may also be employed. Each seal retainer 80 includes a base portion 82 and two arm portions 84, 86 extending up from the base portion at opposite sides of the base portion. The arm portions 84, 86 of the seal retainer 80 are configured to engage the seal 78 and secure the seal so that the seal is seated on the base portion 82 of the seal retainer. In one embodiment, the seal 78 is fabricated from silicone material; however, other suitable materials may be selected. The seal retainer 80 is configured to secure the seal 78 without the need for adhesives or fasteners.

Figure 7:
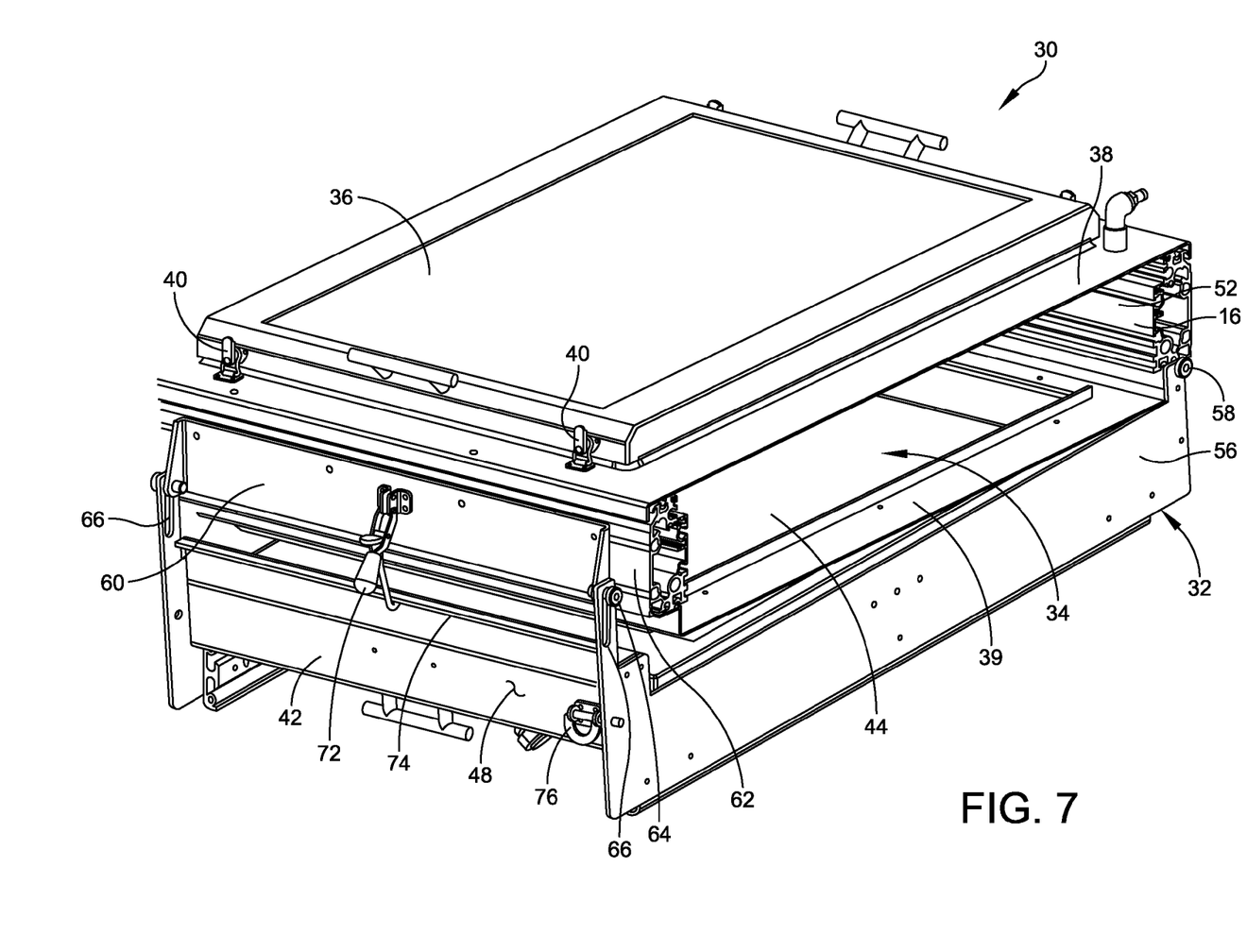
FIG. 7 is a perspective view of the pre-heater assembly with the latch of the pre-heater assembly shown in an unlatched or disengaged position.

Referring to FIG. 7, when the pre-heater 30 is in an operational position, the support tray 42 is in the closed position with the latch 72 employed to retain the support tray in the closed position. The cover 36 is secured to the top cover frame 38 with the latches 40. To move the support tray 42 to an open position, the latch 72 is released, which allows the side plates 54, 56 of the assembly to hinge down on the pivot pins 58 until the slots 66 in the side plates bottom out on the guide pins 64.

Figure 8:
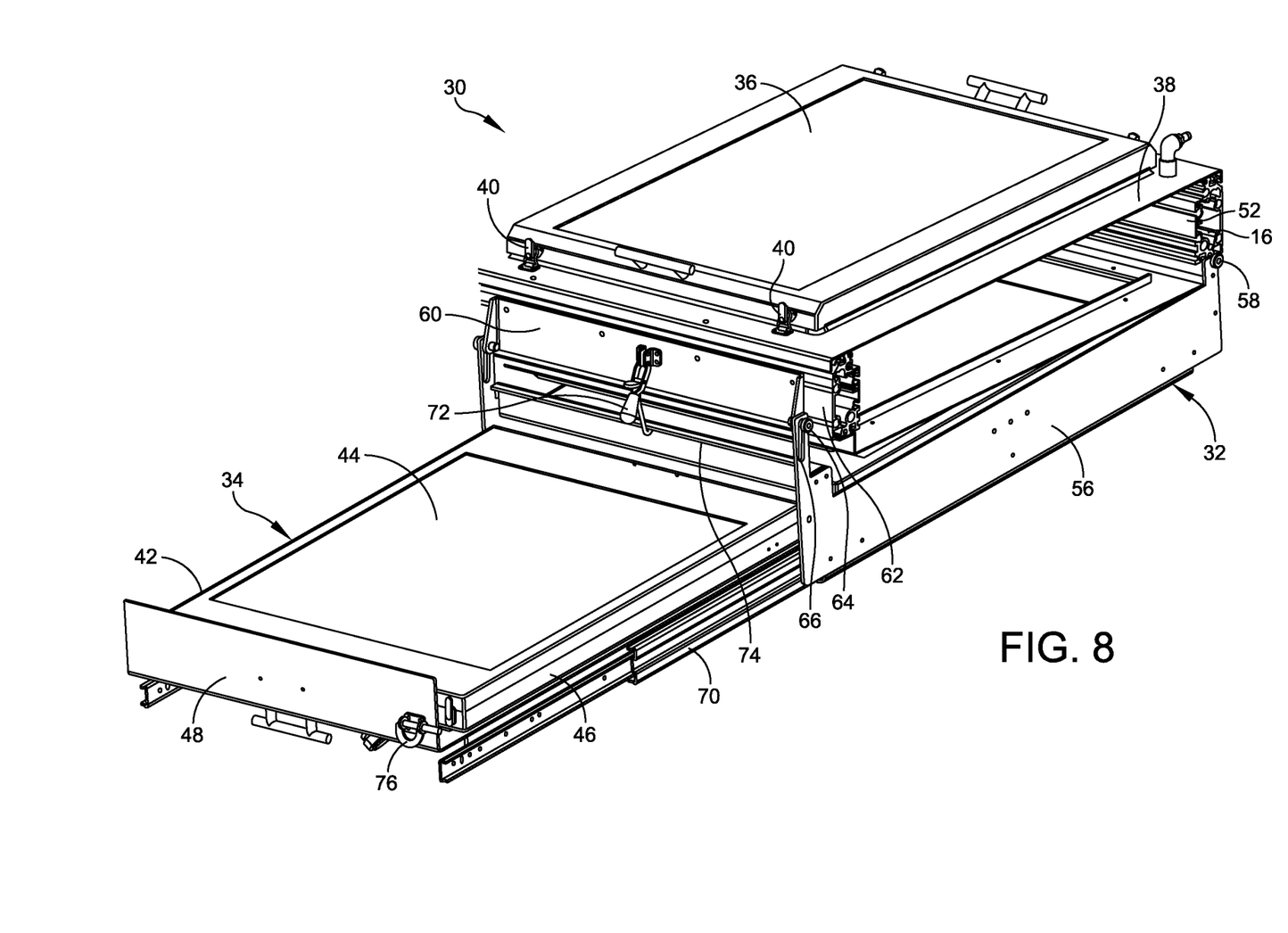
FIG. 8 is a perspective view of the pre-heater assembly with a slide catch of the pre-heater assembly in a retracted position from a side plate, with a support tray of the pre-heater assembly shown in an open position.

Referring to FIG. 8, next, the slide catch 76 is then retracted from the side plate 56 and the pre-heater support tray 42 is allowed to slide out to the maintenance position. The support tray 42 slides out easily from the support frame assembly 32 with the aid of drawer slides 68, 70.

Figure 9:
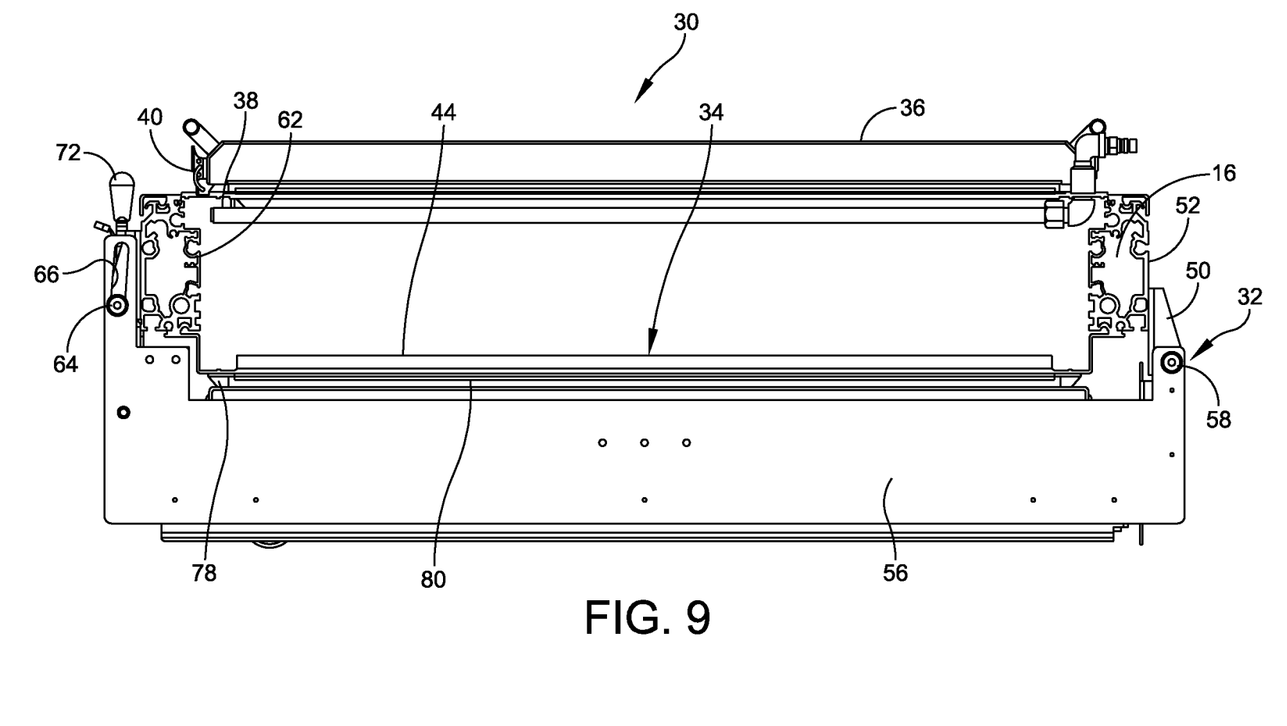
FIG. 9 is an end view of the pre-heater assembly with a latch of the pre-heater assembly shown in a latched or engaged position.

Referring to FIG. 9, the end view of the pre-heater 30 is shown. In this latched position, the heater assembly 34 of the pre-heater 30 is compressing the atmosphere seal 78 to form a tight seal against the bottom cover frame 39. In this position, the tunnel 18 is gas tight so as to preserve an inert atmosphere through the tunnel as the printed circuit board 12 travels through the wave solder machine 10.

Figure 10:
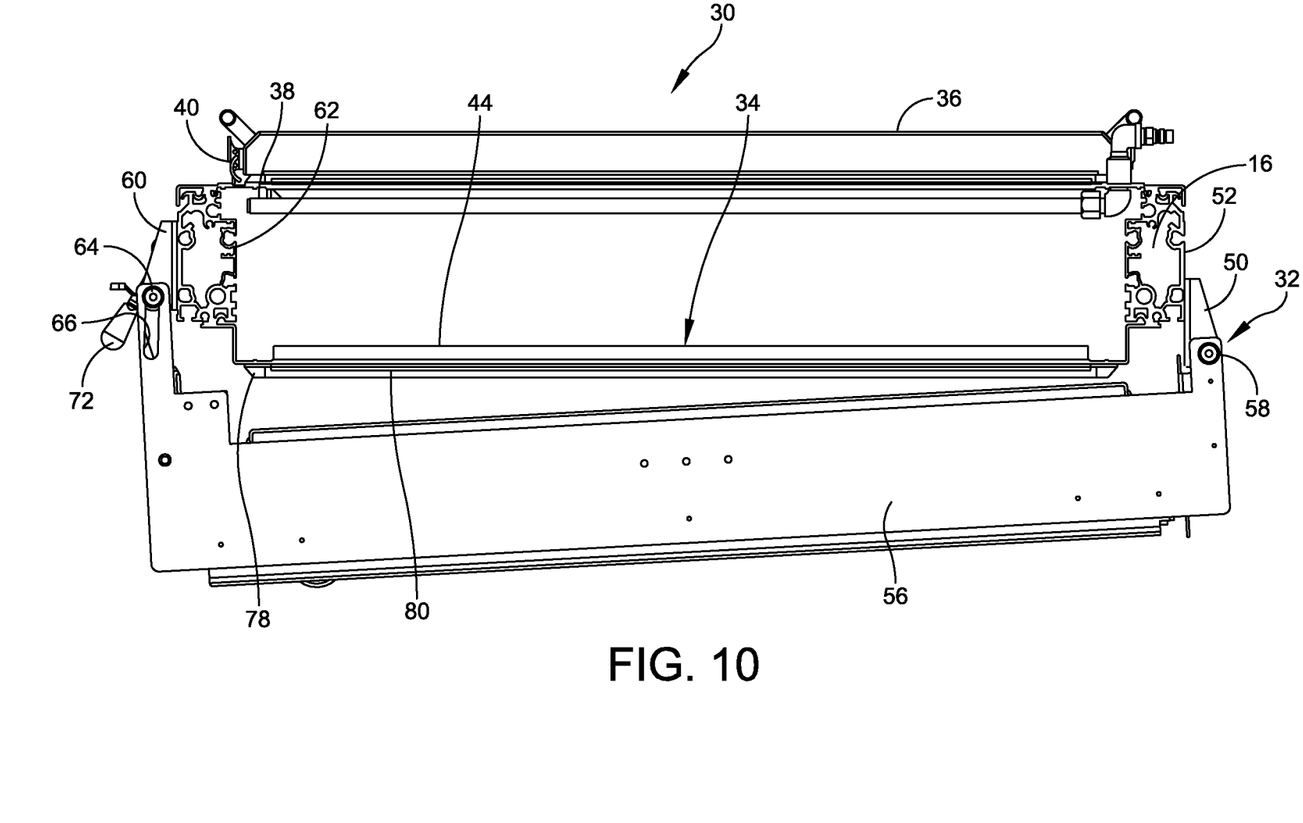
FIG. 10 is an end view of the pre-heater assembly with the latch of the pre-heater assembly shown in the unlatched position.

Referring to FIG. 10, the end view of the pre-heater 30 is shown with the side plates 54, 56 in a hinged down state when the latch 72 is released. As shown, the electric heater element 44 of the heater assembly 34 is no longer in contact with the atmosphere seal 78, which allows for the support tray 42 and the electric heater element unit to be slid out without damaging the seal.

Figure 11:
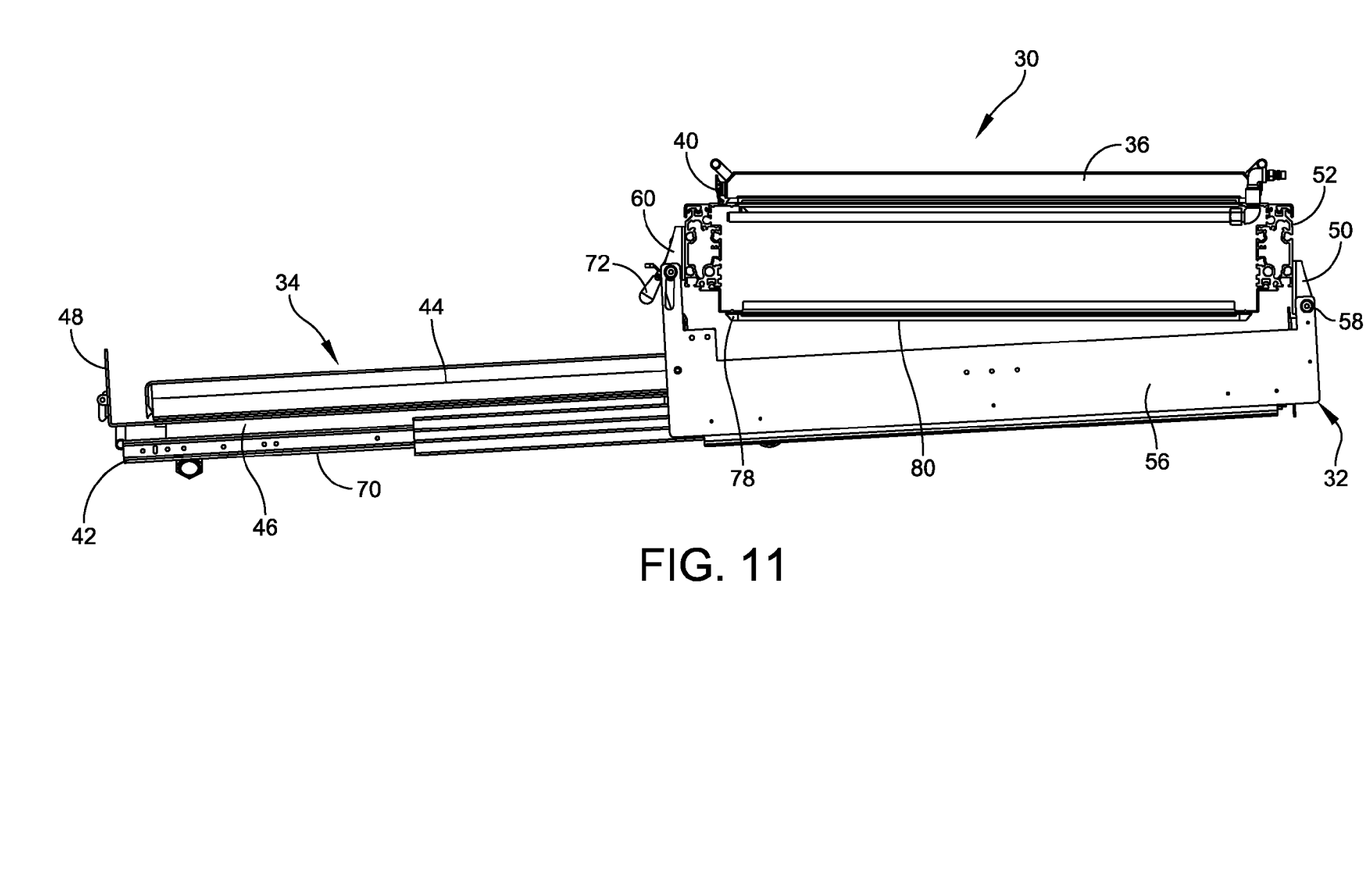
FIG. 11 is an end view of the pre-heater assembly with the support tray of the pre-heater assembly shown in the open position.
Figure 12:
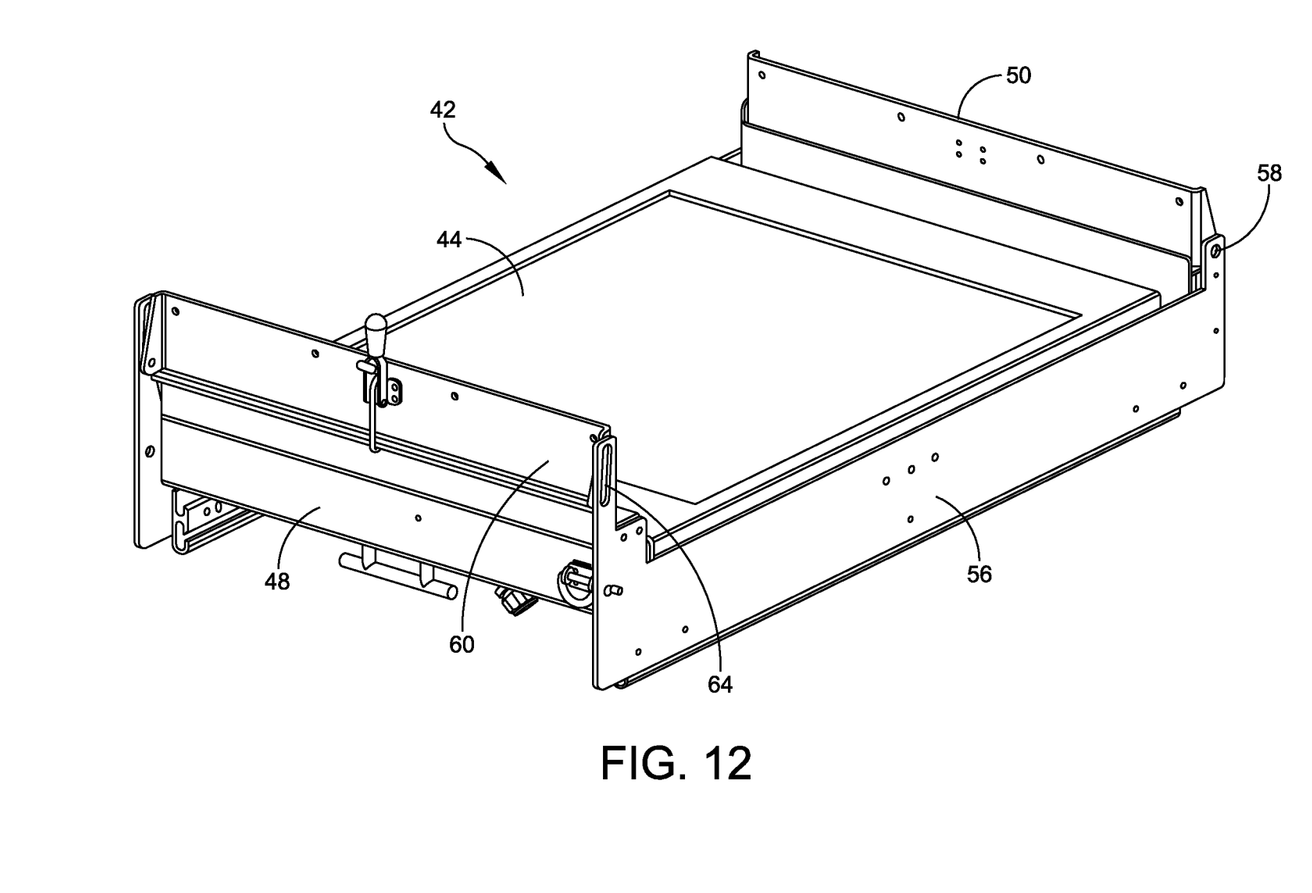
FIG. 12 is a perspective view of the support tray and an electric heater of the pre-heater assembly.

Referring to FIG. 11, the end view of the pre-heater 30 is shown with the pre-heater support tray 42 slid out to expose the electric heater element 44 for maintenance and/or replacement. FIG. 12 illustrates the support tray 42 with the electric heater element 42 provided in the support tray.

Embodiments of the pre-heater may further include modifying the latches, the retainer size and material, and the seal size and material. It should be shown that the latching system for the wave solder pre-heater enables ease of maintenance, while still providing a sealing method to maintain an oxygen-free environment. Additionally, the latching system improves the sealing method, such that replacement of seals, once degraded, are easily removed and replaced.

Thus, it should be observed that the pre-heater of embodiments of the present disclosure reduce machine downtime for maintenance, which can be extremely costly for printed circuit board manufacturers. This pre-heater greatly reduces the length of this downtime by providing a fast and efficient method to slide out pre-heaters for maintenance procedures and replace atmosphere seals.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A wave solder machine configured to perform a wave solder operation on an electronic substrate, the wave solder machine comprising:
   a pre-heating station configured to heat the electronic substrate;
   a wave soldering station configured to attach electronic components to the electronic substrate with solder; and
   a conveyor configured to transport substrates through a tunnel passing through the pre-heating station and the wave soldering station,
   wherein the pre-heating station includes at least one pre-heater including
      a support frame assembly,
      a support tray slidably coupled to the support frame assembly, the support tray being movable between a closed position in which the support tray is slid into the support frame assembly and an open position in which the support tray is slid out of the support frame assembly,
      a heater disposed in the support tray, and
      a latch mechanism configured to releasably secure the support tray in the closed position.

2. The wave solder machine of claim 1, wherein the support frame assembly includes a pivot bracket secured to the tunnel.

3. The wave solder machine of claim 2, wherein the support frame assembly further includes two side plates, each side plate being secured at one end thereof to the pivot bracket by a pivot pin.

4. The wave solder machine of claim 3, wherein the support frame assembly further includes a latch and guide bracket secured to side plates.

5. The wave solder machine of claim 4, wherein the pre-heater further includes a seal disposed between the heater and the support frame assembly, the seal being compressed when the support tray is in its closed position.

6. The wave solder machine of claim 4, wherein the support frame assembly further includes two drawer slides, one for each side plate, configured to enable the support tray to slide between its closed and open positions.

7. The wave solder machine of claim 1, wherein the latch mechanism includes a latch secured to the support frame assembly, the latch mechanism being configured to releasably secure the support tray.

8. The wave solder machine of claim 1, wherein the support frame assembly further includes a slide catch releasably secured to the support frame assembly, the slide catch being configured to prevent the support tray from accidentally sliding out when the support tray is moved to its open position.

* * * * *